(12) United States Patent
Ogimoto

(10) Patent No.: US 8,524,382 B2
(45) Date of Patent: Sep. 3, 2013

(54) OXIDE SUBSTRATE AND MANUFACTURING METHOD THEREFOR

(71) Applicant: Fuji Electric Co., Ltd., Kawasaki (JP)

(72) Inventor: Yasushi Ogimoto, Higashiyamoto (JP)

(73) Assignee: Fuji Electric Co., Ltd. (JP)

(*) Notice: Subject to any disclaimer, the term of this patent is extended or adjusted under 35 U.S.C. 154(b) by 0 days.

(21) Appl. No.: 13/765,156

(22) Filed: Feb. 12, 2013

(65) Prior Publication Data
US 2013/0149528 A1    Jun. 13, 2013

Related U.S. Application Data

(63) Continuation of application No. PCT/JP2012/055342, filed on Mar. 2, 2012.

(30) Foreign Application Priority Data

Mar. 14, 2011 (JP) ................. 2011-055006

(51) Int. Cl.
*B32B 9/00* (2006.01)
*B32B 19/00* (2006.01)
*C30B 23/00* (2006.01)
*C30B 25/00* (2006.01)
*C23C 14/30* (2006.01)
*H05B 7/00* (2006.01)

(52) U.S. Cl.
USPC ........... 428/700; 117/103; 427/596; 428/697; 428/699; 428/701; 428/702

(58) Field of Classification Search
USPC ......... 428/697, 699, 700, 701, 702; 427/596; 117/103
See application file for complete search history.

(56) References Cited

U.S. PATENT DOCUMENTS

| 5,665,664 A | 9/1997 | Tomioka et al. |
| 5,691,279 A * | 11/1997 | Tauber et al. ................. 505/239 |
| 2004/0069991 A1* | 4/2004 | Dunn et al. .................... 257/75 |

FOREIGN PATENT DOCUMENTS

| EP | 0864538 A1 | 9/1998 |
| JP | 08-133894 A | 5/1996 |
| JP | 10-255481 A | 9/1998 |
| JP | 10-261291 A | 9/1998 |
| JP | 2001-278700 A | 10/2001 |
| JP | 2005-213078 A | 8/2005 |

OTHER PUBLICATIONS

Ogimoto et al., "Epitaxial growth of perovskite manganite thin films on high-index substrates", 18th International Workshop on Oxide Electronics, Presentation 1-20, Poster Session A, Sep. 26-28, 2011, p. 46.*

(Continued)

*Primary Examiner* — Jonathan Langman
(74) *Attorney, Agent, or Firm* — Rossi, Kimms & McDowell LLP

(57) ABSTRACT

Some aspects of the invention provide an oxide substrate having a flat surface at the atomic layer level, and suited to forming a thin film of a perovskite manganese oxide. One aspect of the invention provides a single-crystal oxide substrate 10 having a single-crystal supporting substrate 1 of (210)-oriented $SrTiO_3$ and a single-crystal underlayer 2 of $(LaAlO_3)_{0.3}\text{-}(SrAl_{0.5}Ta_{0.5}O_3)_{0.7}$, which is LSAT, formed on the (210) plane surface of the supporting substrate. In another aspect of the present invention, the LSAT underlayer 2A is formed in an amorphous state. Other aspects of the invention are also disclosed.

8 Claims, 5 Drawing Sheets

(56) References Cited

OTHER PUBLICATIONS

Li, et al., "Dependence of Crystallinity on Oxygen Pressure and Growth Mode of La0.3Sr1.7AlTaO6 Thin Films on Different Substrates", Journal of Applied Physics, vol. 87, No. 8, May 1, 2012 (Cited in ISR May 22, 2012 for parent PCT/JP2012/055342).
ISR issued May 22, 2012 for parent PCT/JP2012/055342.

* cited by examiner

850°C

BRIGHT-DARK REVERSAL

BRIGHT-DARK REVERSAL

OXIDE SUBSTRATE AND MANUFACTURING METHOD THEREFOR

CROSS-REFERENCE TO RELATED APPLICATIONS

This application is a continuation of International Application No. PCT/JP2012/055342, filed on Mar. 2, 2012, which is based on and claims priority to Japanese Patent Application No. JP PA 2011-055006, filed on Mar. 14, 2011. The disclosure of the Japanese priority application and the PCT application in their entirety, including the drawings, claims, and the specification thereof, are incorporated herein by reference.

BACKGROUND

1. Technical Field

Embodiments of the invention relate to oxide substrates and manufacturing methods therefor.

2. Related Art

There has been concern in recent years that semiconductor devices may finally be facing the limits of the scaling law, which has been a guiding principle of performance advances in the field. In this context, materials are being developed that will make possible new operating principles to address the situation when the transistor limit is reached or approached. For example, in the field of spintronics, which exploits the spin degrees of freedom of electrons, there has been progress in the development of high-density non-volatile memories capable of high-speed operation at the same level as DRAM (dynamic random access memory).

There has also been progress in research into strongly-correlated electron system materials that cannot be described in terms of band theory, which is a cornerstone of semiconductor device design. Substances have been discovered that exhibit very large and rapid changes in physical properties caused by phase changes in the electron system. In strongly correlated electron system materials, a variety of electron phases with a variety of orders formed by spins, charges and orbitals are possible because the phase state of the electron system is affected not only by the spin degrees of the freedom but also by the degrees of freedom of the electron orbitals. Typical examples of strongly correlated electron system materials are the perovskite manganese oxides, in which a first order phase transition produces a charge-ordered phase by alignment of 3d electrons of manganese (Mn) and an orbital-ordered phase by alignment of the electron orbitals.

In a charge-ordered phase or orbital-ordered phase, electrical resistance increases because the carrier is localized, and the electron phase becomes an insulator phase. The magnetic behavior of this electron phase is that of an antiferromagnetic phase due to the superexchange interactions and double exchange interactions. The electron states of the charge-ordered phase and orbital-ordered phase should often be regarded as semiconductor states. This is because, although the carrier is localized in the charge-ordered phase and orbital-ordered phase, the electrical resistance is lower than that of a so-called band insulator. In accordance with convention, however, the electron phases of the charge-ordered phase and orbital-ordered phase are here called insulator phases. Conversely, when the behavior is metallic with low resistance, the electron phase is a ferromagnetic phase because the spins are aligned. The term "metallic phase" can be defined in various ways, but, as used in portions herein, a metallic phase is one in which "the temperature derivative of resistivity is positively signed." Expressed in this way, the aforementioned insulator phase can be re-defined as one in which "the temperature derivative of resistivity is negative."

A variety of switching phenomena have reportedly been observed in bulk single-crystal materials made of substances capable of assuming either the aforementioned charge-ordered phase or orbital-ordered phase, or a phase that combines both a charge-ordered phase and an orbital-ordered phase (charge- and orbital-ordered phase). See, e.g., Japanese Patent Application Publication Nos. H8-133894, H10-255481 and H10-261291, also referred to herein as Patent Documents 1-3, respectively.

These switching phenomena occur in response to applied stimuli, namely, temperature changes around the transition point, application of a magnetic or electric field, or light exposure. These switching phenomena are typically observed as very large changes in electrical resistance or transitions between antiferromagnetic and ferromagnetic phases. For example, resistance changes by orders of magnitude in response to application of a magnetic field are a well-known phenomenon called colossal magnetoresistance.

To achieve any kind of electronic device, magnetic device or optical device that uses these effects, the switching phenomena must be manifested when the perovskite manganese oxide has been formed as a thin film. As in the case of an ordinary semiconductor device, a single-crystal thin film with few defects is necessary in order to provide high-performance switching properties with little variation in properties. Research is therefore being done using laser ablation methods (or PLD methods), which allow the preparation of high-quality thin films of perovskite manganese oxides. Due to advances in film-forming technology, flat surfaces at the atomic layer level are now being formed in oxide single-crystal thin films. For example, it is now possible to control the atomic layers layer by layer when preparing perovskite manganese oxides if the intensity oscillation of the RHEED (reflection high-energy electron diffraction) is monitored.

To achieve any device with a high degree of utility using a perovskite manganese oxide, the switching phenomena must be manifested at room temperature or above, such as an absolute temperature of 300 K or more. However, the switching phenomena disclosed in the aforementioned documents have all been verified only under low-temperature conditions of about liquid nitrogen temperature (77 K) or less for example. In the perovskite manganese oxides disclosed in the aforementioned documents, the chemical composition can be represented by $ABO_3$, with the atomic stacking planes stacked in a repeating pattern of AO layer, $BO_2$ layer, AO layer ... to form a stacked body. This kind of stacked crystal structure is represented hereunder as AO—$BO_2$—AO. In the perovskite manganese oxides disclosed in the aforementioned documents, trivalent rare earth cations (hereunder represented as "Ln") and a divalent alkaline-earth ("Ae") randomly occupy the A sites in the crystal structure of the perovskite, and it is thought that the temperature at which the switching phenomena are manifested is lowered as a result of this randomness. It is known that the transition temperature for the charge-ordered phase can be elevated to about 500 K by ordering the A-site ions in an AeO—$BO_2$—LnO—$BO_2$—AeO—$BO_2$—LnO—$BO_2$... configuration. Regular arrangement of the ions occupying the A sites as in this example is called "A-site ordering" below. A feature of the group of substances exhibiting such high transition temperatures is that they contain Ba (barium) as an alkaline-earth Ae. For example, transition temperatures above room temperature have been reported with substances containing Ba as an alkaline-earth Ae and using Y (yttrium), Ho (holmium), Dy (dysprosium), Tb (terbium), Gd (gadolinium), Eu (europium) and Sm (samarium), which have small ionic radii, as the rare earth Ln.

For these switching phenomena to be applicable to an electronic device, magnetic device or optical device, they must be manifested when the oxide has been formed as a thin film. In a thin film formed on the surface of a substrate with a (100)-oriented surface ((100)-oriented substrate), the atomic stacking planes form an AO—BO$_2$—AO stacked structure. With this AO—BO$_2$—AO stacked structure, it is easy to order the A sites in a regular way. That is, a (100)-oriented substrate is convenient for ordering the A sites in the direction of film thickness. Conventionally, however, the problem has been that even if a single crystal of perovskite manganese oxide is formed as a thin film on a (100)-oriented substrate, the switching phenomena are not manifested in the resulting (100)-oriented perovskite manganese oxide single-crystal thin film. This is because the in-plane crystal lattice of the single-crystal thin film is fixed to the lattice of the substrate within the substrate plane, and the first order phase transition to a charge-ordered phase or orbital-oriented phase requires a kind of lattice deformation called Jahn-Teller deformation, which is suppressed by fourfold symmetry within the substrate plane.

On the other hand, Japanese Patent Application Publication No. 2005-213078(also referred to herein as "Patent Document 4") discloses forming a perovskite oxide thin film formed using a (110)-oriented substrate. According to this disclosure, the formed thin film allows shear deformation of the crystal lattice during switching when the in-plane fourfold symmetry of the (110)-oriented substrate is broken. That is, in a thin film formed in accordance with Patent Document 4 the crystal lattice is oriented parallel to the substrate plane, while the charge-ordered plane or orbital-ordered plane is non-parallel to the substrate plane. As a result, first order phase transitions involving deformation of the crystal lattice are possible even with a single crystal thin film the crystal lattice of which is fixed to a lattice in an in-plane direction (referred to in portions herein as being "within a plane") parallel to each atomic stacking plane of the substrate. Thus, according to Patent Document 4, a transition or in other words a switching phenomenon at high temperatures equivalent to those obtained with the bulk single crystal can be achieved by using a (110)-oriented substrate.

In a (110)-oriented thin film, the atomic stacking planes are stacked to make an (Ln,Ba)BO—O$_2$—(Ln,Ba)BO stacked body. These atomic layer stacking planes are formed as follows. First, an (Ln,Ba)BO layer is formed, which is an atomic layer consisting of A sites containing a Ba atom or rare earth element Ln (represented as Ln,Ba), B sites and O atoms. An atomic layer containing two O atoms is formed next, followed by another (Ln,Ba)BO layer. In order to achieve A-site ordering in this (Ln,Ba)BO—O$_2$—(Ln,Ba)BO stacked body, an order must be introduced into the A sites in the plane. However, for the sake of ordering the A sites within the plane some factor must provide a driving force for implementing regularity. In fact no such factor exists, and ordering the A sites in a (110)-oriented thin film is not an easy matter.

SUMMARY

The research of the inventor of this application has shown that a (210)-oriented substrate is useful for achieving A-site ordering. That is, the atomic stacking planes of a thin film formed on the surface of a (210)-oriented substrate form a stacked body of atomic layers in a repeating pattern of AO—BO$_2$—AO. As a result, using a (210)-oriented substrate it is possible to achieve A-site ordering in the same way as with a (100)-oriented substrate. Moreover, a first order phase transition is possible with a (210)-oriented substrate because the symmetry is broken in the plane of the substrate. Thus, a (210)-oriented substrate is useful because it makes it possible to achieve both A-site ordering and a first order phase transition.

Based on the research of the inventor of this application, and considering the lattice matching or in other words the small lattice mismatch, strontium titanate (SrTiO$_3$) with a lattice constant of a =0.3905 nm was selected as a suitable material for actually preparing such a (210)-oriented substrate. A single-crystal substrate made of SrTiO$_3$ with a (210)-oriented surface is referred to herein as a "SrTiO$_3$ (210)-oriented single crystal substrate."

However, a different problem can arise using an SrTiO$_3$ (210)-oriented single crystal substrate when an A-site ordered perovskite manganese oxide thin film was actually formed on the surface of this substrate. Within the temperature range for film formation, or in other words a temperature range of about 1000° C. as the substrate temperature for example, the flatness of the surface on which the film is formed is compromised. More specifically, undulated structures in excess of 1 nm were formed on the surface of the substrate. Accordingly, there exists certain problems in the art.

Embodiments of the invention address these and other problems. Embodiments of the invention contribute to the preparation of various devices using perovskite manganese oxide thin films by providing an oxide substrate that maintains surface flatness at the atomic layer level at a substrate temperature of about 1000° C.

After close examination of these problems with a focus on the principles by which undulated structures are formed on the surface of a (210)-oriented single-crystal substrate made of SrTiO$_3$, the inventor of this application discovered that formation of such undulated structures could be suppressed by forming an underlayer of another substance, particularly LSAT, on a SrTiO$_3$ (210)-oriented surface. That is, one aspect of the present invention provides an oxide substrate including a single-crystal supporting substrate of (210)-oriented SrTiO$_3$ and an underlayer formed from (LaAlO$_3$)$_{0.3}$-(SrAl$_{0.5}$Ta$_{0.5}$O$_3$)$_{0.7}$, which is LSAT, on the (210) plane surface of the supporting substrate.

Moreover, one aspect of the present invention provides a method for fabricating an oxide substrate, including: a step of preparing a single-crystal supporting substrate of (210)-oriented SrTiO$_3$; and a step of forming an underlayer of (LaAlO$_3$)$_{0.3}$-(SrAl$_{0.5}$Ta$_{0.5}$O$_3$)$_{0.7}$, or which is LSAT, on the (210) plane surface of the supporting substrate.

As described herein, the term "oxide substrate" can include not only substrates of oxides with a single composition, but also substrates of oxides with multiple compositions.

Moreover, in the case of a single-crystal substrate, the term "oxide substrate" can also include substrates made of multiple materials in which single crystals are formed in continuous regions across multiple materials. Typically, even if the supporting substrate and underlayer have different compositions, if the crystal of the supporting substrate and the crystal of the underlayer are stacked with continuous lattice matching, the substrate consisting of the supporting substrate and underlayer is called a single-crystal substrate.

With some aspects of the invention, the LSAT underlayer makes it possible to maintain the flatness of the substrate surface within the temperature range for subsequently forming the thin film even when a SrTiO$_3$ (210)-oriented single crystal substrate having a suitable lattice constant for lattice matching is used as the supporting substrate. It is thus possible, by way of certain embodiments, to provide a suitable substrate for preparing an A-site ordered perovskite manganese oxide thin film capable of a first order phase transition.

BRIEF DESCRIPTION OF THE DRAWINGS

FIG. 2 is a schematic side view showing the inclination of the crystal lattice when the substrate or underlayer has a (210) plane orientation in a single-crystal substrate or underlayer having a cubic perovskite structure in an embodiment of the present invention, wherein FIG. 2(a) is a side view looking towards the in-plane [1-20] axis, and FIG. 2(b) is a side view looking towards the in-plane [001] axis;

FIGS. 4(a) and 4(b) show a RHEED pattern image taken while forming the underlayer in a crystal state in embodiments of the invention, wherein FIG. 4(a) shows the RHEED pattern as photographed, and FIG. 4(b) shows the same RHEED pattern image processed so as to reverse only the bright and dark parts of the image for ease of observation.

DETAILED DESCRIPTION

Figure 1:
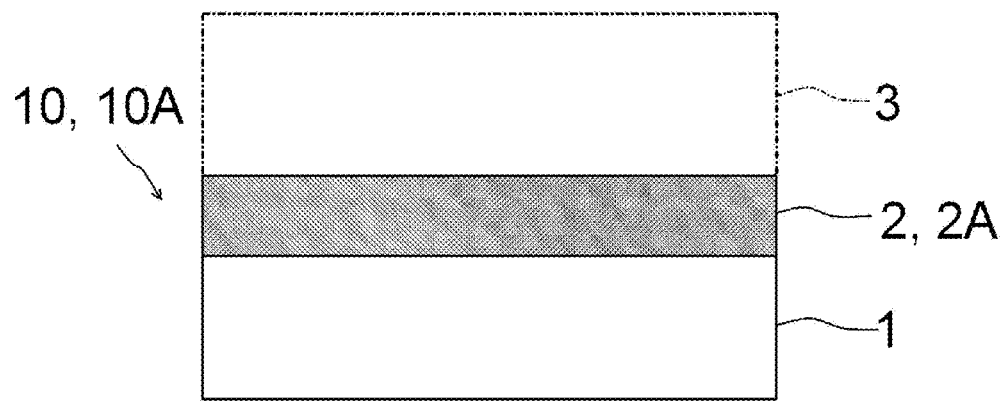
FIG. 1 is a schematic cross-section of an oxide substrate having a supporting substrate and underlayer of an embodiment of the invention.

Embodiments of the oxide substrate of the invention are explained below. Unless specifically mentioned in the explanations below, parts or elements that are common to all drawings are represented by the same reference symbols. In the drawings, the elements of the various embodiments are not necessarily shown to the same scale.

First Embodiment

[Structure]

FIG. 1 is a schematic cross-section of an oxide substrate having a supporting substrate and an underlayer in a first embodiment of the present invention. The oxide substrate of this embodiment is, for example, a single-crystal substrate 10 comprising a single-crystal underlayer 2 formed of $(LaAlO_3)_{0.3}$-$(SrAl_{0.5}Ta_{0.5}O_3)_{0.7}$ or in other words LSAT on the surface of a single-crystal supporting substrate 1 consisting of (210)-oriented $SrTiO_3$. The underlayer 2 formed in this embodiment is an underlayer 2 formed by crystallizing LSAT. This single-crystal substrate 10 is used as an oxide substrate for forming another film in contact with the surface of the underlayer 2. For example, an A-site ordered perovskite manganese oxide thin film 3 (hereunder called "thin film 3") can be formed on the single-crystal substrate 10. An underlayer 2A of LSAT components in an amorphous state can also be used as the underlayer in the present invention. However, this configuration is described below as another embodiment (second embodiment).

Figure 2:
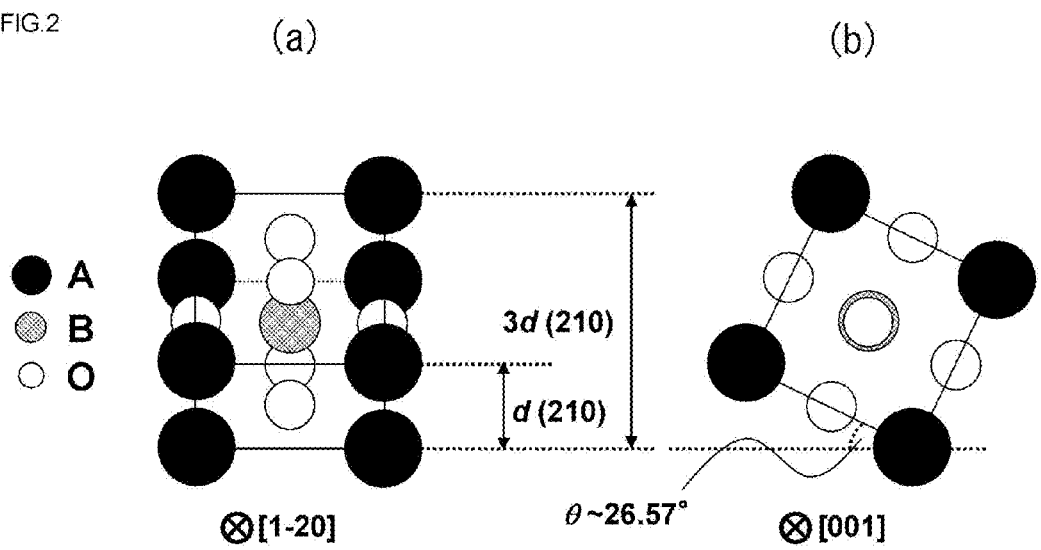

The (210) plane orientation in the supporting substrate 1 and underlayer 2, or in other words in the crystal substrate 10 of this embodiment, is explained next with reference to FIG. 2. FIG. 2 is a schematic side view showing the inclination of the crystal lattice when the supporting substrate 1 or underlayer 2 with a cubic perovskite structure has a (210) plane orientation. For example, the SrTiO used in the supporting substrate 1 assumes a cubic perovskite structure. This cubic perovskite structure is a crystal structure that may be assumed by the supporting substrate 1, the underlayer 2 and the thin film 3 of this embodiment. Therefore, it will be described without loss of generality.

Perovskite structures are generally described as $ABO_3$, with A occupying the apices, B the body center and O (oxygen) the face centers of each unit cell. In explaining this embodiment, the apex sites are called A sites, and the atoms occupying them are called A atoms. The atom occupying the B site in the body center is similarly called a B atom. In the context of this embodiment the perovskite structure is explained in terms of the cubic structure shown in FIG. 2, but this is only for purposes of convenience. Perovskite structures encompassed by this embodiment include not only cubic but also tetragonal, orthorhombic and monoclinic structures and the like, in which the aforementioned A, B and O atoms are arranged at any positions in a crystal lattice with any deformations. Also, for example substances with crystal structures in which the basic unit lattice is only obtained by linking a plurality of the unit cells discussed above are also included in this embodiment.

In FIG. 2, the crystal is drawn with the supporting substrate plane and underlayer surface extending to the left and right in the figure. As shown in FIG. 2, the (210) plane of the crystal lattice, or in other words the plane containing the [1-20] axial direction and [001] axial direction, faces along the plane formed by the supporting substrate plane and underlayer surface. To indicate clearly that the [1-20] axis and [001] axis are the axes in the supporting substrate plane and underlayer surface, they are described as the in-plane [1-20] axis and in-plane [001] axis. In FIG. 2, the [210] axis is drawn in the up-down direction in the figure as seen facing the paper. The direction of this [210] axis is called the direction perpendicular to the plane because it is the normal direction to the supporting substrate surface and underlayer surface. FIGS. 2(a) and 2(b) show a side view of a crystal unit cell seen looking towards the in-plane [1-20] axis (FIG. 2(a)) and a side view of a unit cell seen looking towards the in-plane [001] axis (FIG. 2(b)).

The angle θ of the substrate surface relative to the (100) plane, or in other words the angle of the (210) plane relative to the (100) plane, is about 26.56 degrees. In the supporting substrate 1 or underlayer 2, the atomic planes are stacked alternating AO—$BO_2$—AO in the direction perpendicular to the surface. In the supporting substrate 1 or underlayer 2, the lattice spacing of the (210) planes perpendicular to the surface is given by:

$$d(210) = a \cdot \sin \theta \quad \text{(Formula 1)}$$

The value of this d(210) gives the lattice spacing of the SrO—$TiO_2$—SrO planes in the SrTiO used in the supporting substrate 1, and substituting 26.56 degrees for θ and 0.3905 nm for a gives 0.1746 nm as d(210). Considering that the unit cells of the cubic crystal are inclined 26.56 degrees from the (100) plane orientation, the spacing perpendicular to the surface is 3×d(210) or 0.5238 nm. FIG. 2(a) shows an example of the spacing represented by d(210) and 3×d(210). Considering also the periodicity of the in-plane atomic positioning, the length period perpendicular to the surface is 5×d(210) or 0.873 nm.

The spacing represented by 3×d(210) in FIG. 2(a) corresponds to the thickness between one AO atomic layer and the next AO atomic layer, corresponding to an atomic cell. Therefore, underlayer 2 is formed so as to obtain a thickness of 3×d(210) or more with the aim of covering the surface of the supporting substrate 1 with the underlayer 2. It is thus possible to effectively prevent the surface of supporting substrate 1 from being exposed.

[Manufacturing Method]

Figure 3:
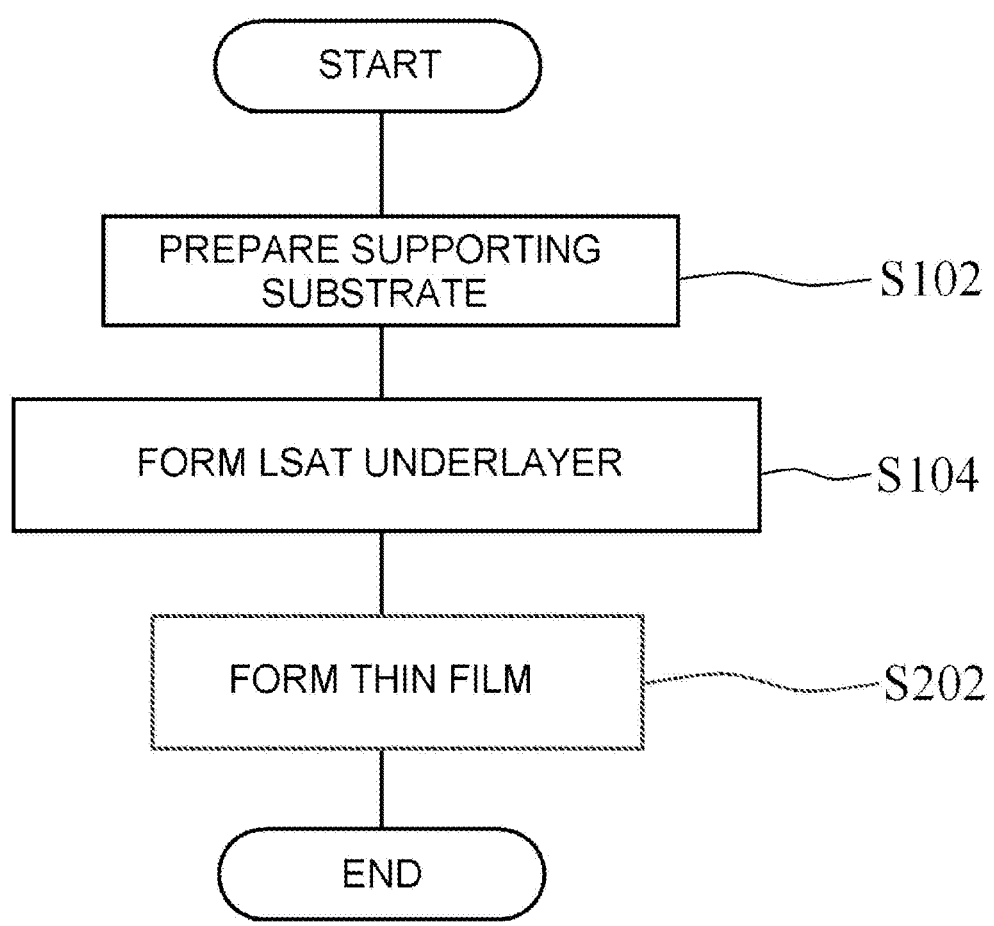
FIG. 3 is a flow chart showing a manufacturing method including the process of manufacturing a single-crystal substrate through the formation of a thin film on the single-crystal substrate in accordance with embodiments of the invention.

The method of manufacturing a single-crystal substrate 10 with the aforementioned crystal structure is explained next. FIG. 3 is a flow chart showing a manufacturing method including the process of manufacturing the single-crystal substrate 10 through the formation of the thin film 3 on the single-crystal substrate 10. First, supporting substrate 1 is prepared for manufacturing single-crystal substrate 10 (S102). This is accomplished for example by holding a supporting substrate 1 cut with a single-crystal (210) plane orientation from $SrTiO_3$ in a vacuum chamber. Next, an LSAT single-crystal underlayer 2 is formed on the (210) plane surface of the supporting substrate 1 (S104). The underlayer is formed by laser ablation for example, by depositing LSAT onto the (210) plane surface of the supporting substrate 1 from an LSAT target placed facing the supporting substrate 1. The supporting substrate 1 is heated as necessary during this process so as to form the underlayer 2 as a single crystal grown coherently with the crystal of the supporting substrate 1. This completes manufacture of the single-crystal substrate 10, which can then be removed as necessary from the vacuum chamber for example and stored. After this, the thin film 3 is formed as necessary on the surface of the single-crystal substrate 10 having the LSAT underlayer 2 formed thereon (S202). When the underlayer 2 is a single crystal grown coherently on the crystal of the supporting substrate 1, the thin film 3 can be grown coherently on the single-crystal substrate 10 as a whole as the substrate.

[Observation Examples of Changes in Surface State at High Temperatures]

(Observation Example 1)

Next, changes caused by temperature in the surface state of the substrate during film formation are explained as observation examples. Specifically, using a $SrTiO_3$ (210)-oriented single crystal substrate as the supporting substrate 1, changes in the surface form of the supporting substrate 1 from annealing at various temperatures within a range above 1000° C. are explained as Observation Example 1. This annealing is performed for example to reproduce the conditions of heating the substrate when forming the thin film 3 coherently by laser ablation afterward.

First, to model the effects of the heat of film formation using the supporting substrate 1 alone with no underlayer 2 formed thereon, the surface state of a commercial sample of $SrTiO_3$ (210)-oriented single-crystal substrate before annealing (bare substrate sample) was investigated by AFM (atomic force microscopy). When the surface of the bare substrate sample was observed by AFM before annealing, the surface was flat on a sub-nanometer level, although some vague structures were observed.

To investigate behavior at high temperatures, the bare substrate sample was annealed for 12 hours in atmosphere at a substrate temperature of 1100° C. However, the bare substrate sample that was annealed in this way no longer showed the specular component of the RHEED pattern, but instead exhibited an arrowhead-shaped diffraction pattern (not shown) in the position where a diffraction pattern of Laue spots and streaks would normally be observed, corresponding to crystal plane (100) and (010) facet formation in the cubic crystal. Moreover, undulated structures with an increased height difference of about 3 nm were confirmed when the surface of this bare substrate sample was observed by AFM.

To further investigate the effects of temperature, the bare substrate sample was annealed at an increased temperature of 1180° C. The time and atmosphere conditions were not changed. There was no great change in the RHEED pattern, but undulated structures with an even greater height difference of about 6 nm were observed by AFM.

It should be noted that the height difference in the undulated structures occurring due to annealing at 1000° C. or 1100° C. on the surface of the (210)-oriented supporting substrate 1 (bare substrate sample) is much greater than the height difference expected with ordinary step-and-terrace structures. The height difference observed with ordinary step-and-terrace structures is a value similar to the height difference produced by the step (lattice constant a above) of roughly 0.39 nm between one atomic layer $AO_2$ and the next atomic layer $AO_2$ in the θ inclined (100) plane in FIG. 2, or the height difference produced by the directional cosign in the direction perpendicular to this step (that is, 2×d(210)). Even if 5×d(210) occurred as a lattice constant in the step part, it would still be less than 0.9 nm as discussed above. Thus, the height difference of about 3 nm or 6 nm observed with the bare substrate sample is too large to be explained in terms of the height differences produced by a step-and-terrace structure. Therefore, the surface structures or in other words undulated structures that cause the height differences seen with a bare substrate sample or other supporting substrate 1 alone are clearly different from conventional step-and-terrace structures.

(Observation Example 2)

To determine the reason for the formation of the aforementioned undulated structures by annealing in the bare substrate sample, the effects of similar annealing were then investigated with a perovskite oxide single crystal of a different material as Observation Example 2. In general, it is known that in oxide single crystals, step-and-terrace structures formed of surface miscut angles are produced by means of an annealing step in atmosphere at about 1000° C. and a wet etching step with acid. Therefore, a commercial substrate of $(LaAlO_3)_{0.3}$-$(SrAl_{0.5}Ta_{0.5}O_3)_{0.7}$ or in other words LSAT was prepared as a sample for heat treatment. The plane orientation of the LSAT substrate is the same (210) plane orientation as the supporting substrate 1. This substrate is called the (LSAT) (210) substrate sample below.

When the LSAT (210) substrate sample was observed by AFM before annealing, only vague structures were observed, and no particular step-and-terrace structures or undulated structures with a larger height difference were seen. That is, the surface of the LSAT (210) substrate sample before annealing was similar to the surface of the supporting substrate 1 before annealing. Next, the LSAT (210) substrate sample was annealed for 12 hours in atmosphere at 1100° C. Formation of step-and-terrace structures on the surface of the LSAT (210) substrate sample was confirmed by AFM after annealing. However, the height difference produced by the formed step-and-terrace structures was about 0.5 to 1 nm, equivalent to an LSAT unit cell or twice that. No undulated structures such as those seen on the supporting substrate 1 before annealing that would cause an increased height difference were observed in the LSAT (210) substrate sample.

[Mechanism of Change in Surface State: $SrTiO_3$ (210) -oriented Substrate]

Observation Examples 1 and 2 above show that the surface flatness of a perovskite oxide at temperatures of about 1000° C. is dependent on the substance. Therefore, investigation was conducted into the physical mechanism whereby undulated structures with a height difference of several nm were formed only in the $SrTiO_3$ (210) substrate sample by annealing at about 1000° C. in Observation Examples 1 and 2. In $SrTiO_3$ (100) substrates in general, it is known that Sr or its oxide SrO is segregated on the surface of the substrate when it is annealed in atmosphere. However, no such segregation phenomenon has been reported with LSAT (100) substrates. This shows that under thermal equilibrium conditions determined by the annealing temperature and the oxygen partial pressure in atmosphere, the thermodynamically stable state in $SrTiO_3$ is one in which Sr deficiencies are produced in the internal A sites and the resulting Sr (or SrO) is segregated on the surface, while in LSAT no such A-site deficiencies are produced.

More specifically, comparing the amount of surface energy for each plane when each plane of a perovskite crystal structure is exposed on the surface, the surface energy is the lowest when the (100) plane is exposed. As a result, when Sr or SrO is segregated the thermal energy supplied by annealing causes the segregated Sr or SrO to migrate on the surface, growing crystals as it is deposited in a direction perpendicular to either the (100) plane or the equivalent (010) plane direction. When the plane orientation is (210), however, the [1-20] axial direction and [–120] axial direction lack symmetry in the crystal lattice of the internal atomic layers. This asymmetry results in a difference in crystal growth rates between the (100) plane and (010) plane, thereby producing undulated structures with a height difference equal to several unit cells. Moreover, these undulated structures are formed so as to extend in the [001] axial direction.

When the surface of the substrate has been cut by polishing but not annealed, as in the case of a commercially purchased substrate, it is a matter of chance whether the atomic layer of the terminal (outermost) plane is SrO or $TiO_2$. After polishing, the applied thermal energy of annealing naturally causes these components to migrate in search of a stable position on the surface. From the standpoint of surface energy, the stable state is one in which SrO or $TiO_2$ is deposited on a plane grown with anisotropy from Sr or SrO. That is, SrO or $TiO_2$ acts to reinforce the anisotropy supplied by the Sr or SrO, which is already growing with anisotropy. It is thought that undulated structures with a height difference much larger than that of a unit cell are formed by this mechanism.

[Mechanism of Change in Surface State: LSAT (210)-oriented Substrate]

In the case of an LSAT (210)-oriented substrate, on the other hand, the reasons why the surface flatness of the single-crystal substrate is maintained is as follows. In an LSAT (210)-oriented substrate, there is no initial segregation of Sr or SrO. As a result, the (100) plane or (010) plane does not grow anisotropically. Thus, no undulated structures greater than a unit cell step are produced even under high temperature conditions.

[Constitution for Suppressing Undulated Structures]

Based on these considerations, the inventor of this application had the idea of forming an LSAT single-crystal underlayer 2 in advance by laser ablation on a supporting substrate 1 ($SrTiO_3$ (210) substrate) as a cap layer for the supporting substrate 1 as shown in FIG. 1. Formation of the LSAT single-crystal underlayer 2 can be accomplished by laser ablation with the supporting substrate 1 thoroughly heated at an achieved temperature of about 700° C. for example. Since the lattice constant of the LSAT here is 0.387 nm, there is little lattice mismatch with the lattice constant a (0.3905 nm) of the $SrTiO_3$ (210) substrate. As a result, an LSAT single crystal can be grown coherently on the $SrTiO_3$ (210) substrate as supporting substrate 1, and the in-plane lattice constant of the underlayer formed by the prepared LSAT single crystal can be made identical to that of the $SrTiO_3$ if the LSAT single crystal is thin. Thus, the single-crystal substrate 10 formed from the supporting substrate 1 and the underlayer 2 will certainly be suitable as a single-crystal substrate for forming an A-site ordered perovskite manganese oxide thin film. Based on such considerations, two different samples of the single-crystal substrate 10 were prepared by actually forming LSAT single-crystal underlayers 2 on supporting substrates 1.

[Example: Preparation of Underlayer Formed by LSAT Single Crystal]

In the samples of Examples 1 and 2, an achieved temperature of 700° C. of the supporting substrate 1 and an oxygen partial pressure of 1 mTorr (0.133 Pa) were adopted as the laser ablation conditions for depositing LSAT in order to form an underlayer 2 of an LSAT single crystal in contact with one side of the supporting substrate 1. The supporting substrate 1 was a $SrTiO_3$ (210) substrate. It was confirmed in advance that with substrate heating at 700° C., the surface flatness of the supporting substrate 1 of $SrTiO_3$ (210) was maintained at the same level as before heating.

The thickness of the LSAT single-crystal underlayer 2 formed on the supporting substrate 1 was determined by the following procedures. First, two thicknesses were adopted, the thickness of a single unit cell or 3×d (210) and the thickness of 5 unit cells or 15×d (210). Using samples of supporting substrate 1 of $SrTiO_3$ (210) with LSAT single-crystal underlayers formed thereon with these thicknesses as the samples of Examples 1 and 2, the samples were annealed for 12 hours in atmosphere at an achieved temperature of 1100° C. of the supporting substrate. As a result, no undulated structures having a height difference above the level of step-and-terrace structures were found in the samples of Examples 1 and 2.

Figure 4:
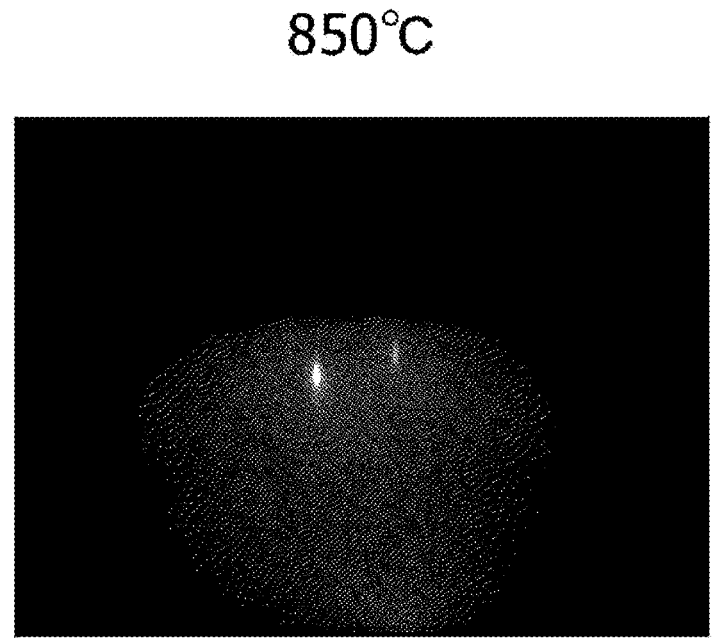
Figure 4:
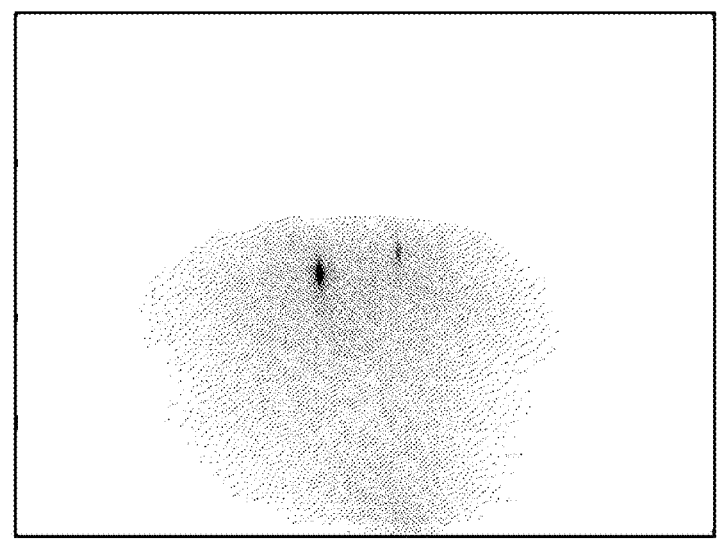

FIGS. 4(a) and 4(b) show a RHEED pattern image taken while forming the underlayer 2 in a crystal state in the sample of Example 2. FIG. 4(a) is the original RHEED pattern image, and FIG. 4(b) is the same RHEED image, image processed so as to reverse only the bright and dark parts for ease of observation. On the paper, each image is shown as a halftone image using the density of fine black and white pixels. In the sample of Example 1, in which the underlayer 2 was formed with the thickness of 1 unit cell (3×d(210)), the RHEED pattern was the same as in FIGS. 4(a) and 4(b).

FIGS. 4(a) and 4(b) show a RHEED pattern observed after the LSAT single-crystal underlayer 2 was formed at 700° C., and the temperature of the supporting substrate was raised to 850° C. There is an obvious diffraction pattern consisting of a specular component and Laue spots, which appear when the surface is flat at an atomic level. It is notable that the arrowhead-shaped diffraction pattern that appeared on the surface of the supporting substrate 1 when no underlayer 2 was formed does not appear in this RHEED image. That is, this pattern indicates the absence of facet formation by the (100) plane and (010) plane, corresponding to an arrowhead-shaped diffraction pattern, and the absence of the resulting undulated structures. Moreover, the spacing of the specular component and Laue spots is the same as the spacing observed on the surface of the $SrTiO_3$ (210) supporting substrate 1, confirming that the in-plane lattice of the LSAT underlayer 2 matches the lattice constant of the supporting substrate 1. As a result, the underlayer 2 formed in a crystal state has a flat surface lacking even step-and-terrace structures. This was also confirmed by separate AFM observation (not shown). The same was true of the sample of Example 1.

The following mechanisms are a possible explanation of why these results were obtained for the samples of Example 1 and 2. First, it is thought that production of Sr deficiencies and segregation of the resulting Sr on the surface of the supporting substrate 1 was suppressed by forming the LSAT of the underlayer 2 on the $SrTiO_3$ (210) of the supporting substrate 1. Moreover, as discussed above in the observation examples, on the surface of LSAT by itself, which was used as the underlayer 2, no larger height differences such as undulated structures occurred on the surface, and sufficient surface flatness was maintained. It is hypothesized that results such as those obtained for the samples of Examples 1 and 2 are achieved through a combination of these phenomena. That is, it is thought that formation of height differences in undulated structures is suppressed because the LSAT layer functions as a cap layer blocking segregation of Sr or its oxide SrO, with the result that the surface flatness of the substrate is maintained at high temperatures. The results of Observation Example 2 suggest that step-and-terrace structures may be formed under high temperature conditions (1100° C.) in the underlayer 2. However, the height differences this produces is about 0.5 to 1 nm, different from the larger height difference of the bare substrate sample, and does not affect the subsequent formation of the thin film 3.

Thus, the single-crystal substrate 10 of this embodiment provides a substrate surface that maintains the flatness in the supporting substrate 1, which is a $SrTiO_3$ (210) single-crystal substrate having a suitable lattice constant from the standpoint of low lattice mismatch, even when heated at temperatures of 1000° C. or more when forming the thin film 3, which is a thin film of A-site ordered perovskite manganese oxide. Moreover, because the in-plane lattice constant of the LSAT single-crystal underlayer 2 is identical to that of $SrTiO_3$, a single-crystal substrate 10 using the underlayer 2 is suitable as a single-crystal substrate for forming an A-site ordered perovskite manganese oxide thin film. Using the single-crystal substrate 10, it is possible to prepare a good crystal thin film of A-site ordered perovskite manganese oxide capable of a first order phase transition.

Second Embodiment

[Structure]

Next, a substrate 10A is explained that uses an underlayer 2A in an amorphous state in place of the underlayer 2 of the first embodiment. The material of the underlayer 2A is the same LSAT used in the underlayer 2. Also, the supporting substrate 1 is a $SrTiO_3$ (210)-oriented single crystal substrate similar to that of the first embodiment.

Substrate 10A has the same layer composition as the single-crystal substrate 10, except that the underlayer 2A is in an amorphous state as explained above. FIG. 1 also shows the configuration of this substrate 10A. The method of manufacturing the substrate 10A of this embodiment is similar to the method of fabricating the single-crystal substrate 10 as explained based on FIG. 3. However, looking at the aforementioned method of fabricating the substrate 10 of the first embodiment, because the LSAT underlayer 2A is produced without crystallization, the achieved temperature of the supporting substrate 1 during treatment to form the underlayer 2A is changed to 600° C. for example. If the temperature achieved by heating supporting substrate 1 during formation of thin film 3 using the substrate 10A is sufficient to crystallize the underlayer 2A, the underlayer 2A may be crystallized by the same heat used to form the thin film 3.

EXAMPLES

Figure 5:
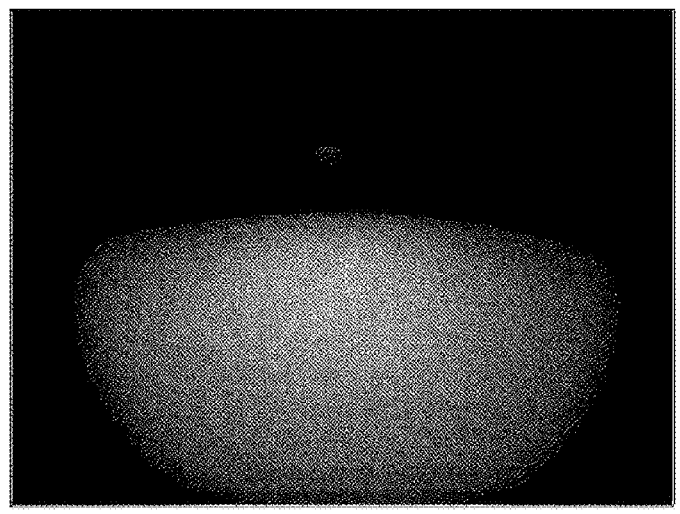
FIGS. 5(a) and 5(b) show a RHEED pattern image taken while forming the underlayer in an amorphous state in embodiments of the invention.
Figure 5:
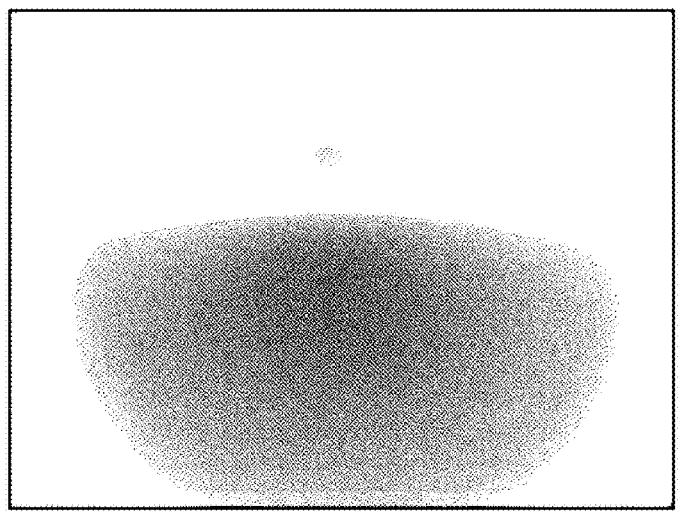

A sample (sample of Example 3) was prepared having the configuration of substrate 10A. FIGS. 5(a) and 5(b) show a RHEED pattern image taken during formation of the underlayer 2A in an amorphous state in the sample of Example 3. FIG. 5(a) shows the original RHEED pattern, and FIG. 5(b) shows the same RHEED pattern with the dark and bright areas reversed for ease of observation. As in FIG. 4, each image on the sheet of this figure is shown as a halftone image using the density of fine black and white pixels. In the sample of Example 3 as well, the underlayer 2A was formed by laser ablation. Specifically, the LSAT underlayer 2A in an amorphous state was formed at an achieved temperature of 600° C. of the supporting substrate 1, a temperature at which no crystallization occurs, under conditions that would produce a thickness corresponding to 5 unit cells if the LSAT underlayer were formed with crystallization.

In the RHEED pattern in FIGS. 5(a) and 5(b), a halo pattern corresponding to the amorphous state of the underlayer 2A formed on the supporting substrate 1 is shown clearly in FIGS. 5(a) and 5(b). Thus, the underlayer 2A was in an amorphous state containing no crystals at all.

Next, changes in the crystal structure of the underlayer 2A were investigated by annealing the sample of Example 3 comprising the substrate 10A with the amorphous underlayer 2A formed thereon. Specifically, the sample of Example 3 was annealed for 12 hours in atmosphere at an achieved temperature of 850° C. of the supporting substrate. As a result of annealing, a diffraction pattern consisting of a specular component and Laue spots and streaks was observed in the RHEED pattern of the underlayer 2A previously formed in an amorphous state. That is, annealing at 850° C. initiated crystallization of the underlayer 2A. The lattice constant in the crystals of an underlayer 2A formed in this way were confirmed to match those of the crystal lattice of the supporting substrate 1, since the spacing of the Laue spots and streaks was the same as the spacing in the diffraction pattern of the surface of the supporting substrate 1.

[Formation of Thin Film 3 Using Underlayer in an Amorphous State]

It is believed that both the crystallized underlayer 2 explained in the first embodiment and the amorphous underlayer 2A explained in the present embodiment can be used as a substrate for forming a thin film 3 that achieves A-site ordering. That is, even using a substrate 10A having an underlayer 2A in an amorphous state, the underlayer 2A of the substrate 10A can be crystallized by heating afterward, judging from the experimental results for the sample of Example 3. Therefore, depending on the temperature for forming the thin film 3, it may be possible to crystallize the underlayer 2A during formation of the thin film 3 on its surface even using an underlayer 2A in an amorphous state as the underlayer of the substrate 10A. That is, with the configuration of this embodiment it is possible to simultaneous achieve crystallization of the underlayer 2A and formation of the thin film 3.

[Selection Criterion for Amorphous Underlayer]

A substrate 10A having an amorphous underlayer 2A is selected based on a particular criterion. This criterion is that a substrate 10A having an amorphous underlayer 2A is used when the achieved temperature of the supporting substrate 1 during formation of the thin film 3 is higher than the temperature for crystallizing the underlayer 2A in an amorphous state. In other words, a substrate 10A having an underlayer 2A in an amorphous state cannot be used if the achieved temperature of the supporting substrate during formation of the thin film 3 is lower than the temperature for crystallizing the underlayer 2A in an amorphous state. Other researches by the inventor have shown that the temperature that initiates crystallization of an amorphous film of LSAT is 800° C. or higher, such as 850° C. Thus, when the thin film 3 is formed at a temperature above that at which this crystallization is initiated, such as a substrate temperature of about 1000° C., it is useful to use an underlayer 2A in an amorphous state. On the other hand, there is no preferred range for the temperature for forming thin film 3 when a single-crystal substrate 10 having a crystalline underlayer 2 as explained in the first embodiment is selected for forming the thin film 3.

Thus, the substrate 10A of this embodiment can also provide effects similar to those of the single-crystal substrate 10 of the first embodiment. That is, it provides a substrate surface that maintains flatness even after treatment at a substrate temperature of about 1000° C. when forming the thin film 3, which is a thin film of A-site ordered perovskite manganese oxide. In addition, because the LSAT underlayer 2A is also crystallized by heat, it is possible to form a single-crystal underlayer of LSAT with exactly the same in-plane lattice constant as $SrTiO_3$.

Embodiments of the present invention are explained in detail above. The aforementioned embodiments and examples are described in order to explain embodiments of the invention, and the materials and compositions of the thin films and substrates given as examples of these embodiments and their film thicknesses, formation methods and the like are not limited to these embodiments. The scope of the invention of this application should be determined based on the descriptions of the Claims. Modified examples within the scope of the invention, including other combinations of these embodiments, are included within the scope of the Claims.

Embodiments of the invention can be used as an oxide substrate for preparing thin-film devices using first order phase transition caused by charge and orbital ordering at room temperature.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

What is claimed is:

1. An oxide substrate comprising:
   a single-crystal supporting substrate of (210)-oriented $SrTiO_3$; and
   an underlayer of $(LaAlO_3)_{0.3}$-$(SrAl_{0.5}Ta_{0.5}O_3)_{0.7}$, which is LSAT, formed on the (210) plane surface of the supporting substrate.

2. The oxide substrate according to claim 1, wherein the LSAT underlayer is formed in a crystal state.

3. The oxide substrate according to claim 2, wherein the thickness of the LSAT underlayer is 3×d(210) or more given d(210) as the lattice spacing of the LSAT (210) plane.

4. The oxide substrate according to claim 1, wherein the LSAT underlayer is formed in an amorphous state.

5. A method for manufacturing an oxide substrate, comprising:
   a step of preparing a single-crystal supporting substrate of (210)-oriented $SrTiO_3$; and
   a step of forming an underlayer of $(LaAlO_3)_{0.3}$-$(SrAl_{0.5}Ta_{0.5}O_3)_{0.7}$, which is LSAT, on the (210) plane surface of the supporting substrate.

6. The method for manufacturing an oxide substrate according to claim 5, wherein the thickness of the LSAT underlayer is 3×d(210) or more given d(210) as the spacing of atomic layers of the LSAT (210) plane.

7. The method for manufacturing an oxide substrate according to claim 5, wherein the step of forming the LSAT underlayer is performed at a supporting substrate temperature at which the LSAT underlayer is formed in a crystal state.

8. The method for manufacturing an oxide substrate according to claim 5, wherein the step of forming the LSAT underlayer is performed at a supporting substrate temperature at which the LSAT underlayer is formed in an amorphous state.

* * * * *